United States Patent [19]
Jin et al.

[11] Patent Number: 6,148,128
[45] Date of Patent: Nov. 14, 2000

[54] PASSIVELY TEMPERATURE-COMPENSATED WAVELENGTH-TUNABLE DEVICE COMPRISING FLEXED OPTICAL GRATINGS AND COMMUNICATION SYSTEMS USING SUCH DEVICES

[75] Inventors: Sungho Jin, Millington; Hareesh Mavoori, Berkeley Heights, both of N.J.

[73] Assignee: Lucent Technologies Inc., Murray Hill, N.J.

[21] Appl. No.: 09/162,324

[22] Filed: Sep. 28, 1998

[51] Int. Cl.$^7$ ........................................... G02B 6/34
[52] U.S. Cl. .................. 385/37; 385/16; 385/19; 372/20; 359/130; 359/341
[58] Field of Search .................. 385/37, 6, 12, 385/16, 19, 137, 31; 372/20, 64; 359/115, 124, 130, 341

[56] References Cited

U.S. PATENT DOCUMENTS

| | | | |
|---|---|---|---|
| 5,999,546 | 12/1999 | Espindola et al. | 372/20 |
| 6,055,348 | 4/2000 | Jin et al. | 385/37 |

*Primary Examiner*—Phan T. H. Palmer
*Attorney, Agent, or Firm*—Mathews, Collins, Shepherd & Gould, P.A.

[57] ABSTRACT

In accordance with the invention, a passively temperature-compensated tunable optical grating device comprises a grating, which is fixed at both ends to a support frame, and is mechanically or magnetically flexed so that a tensile strain induced in the grating reconfigures the resonant wavelength of the grating. Preferred embodiments include at least one waveguide grating, a flexing mechanism capable of inducing a latchable change in grating periodicity and at least one negative thermal expansion component which, upon heating, reduces the strain in the grating so that the temperature-induced wavelength shift is substantially cancelled out. The device can reduce the temperature-dependent wavelength change to less than 0.5 nm/100 deg. C, and preferably less than 0.05 nm/100 deg. C. In a preferred embodiment, the packaging assembly also includes a fine-wavelength adjusting mechanism for post-assembly corrective tuning. The device is especially useful in WDM communication systems, particularly for adding or dropping channels, for dynamically gain-equalizing optical amplifiers, for tunable lasers, and for dispersion compensation.

21 Claims, 4 Drawing Sheets

PASSIVELY TEMPERATURE-COMPENSATED WAVELENGTH-TUNABLE DEVICE COMPRISING FLEXED OPTICAL GRATINGS AND COMMUNICATION SYSTEMS USING SUCH DEVICES

FIELD OF THE INVENTION

The present invention relates to passively temperature-compensated optical grating devices and to communication systems using them. In particular, it concerns grating devices packaged such that the resonant wavelength of the grating is substantially temperature-independent.

BACKGROUND OF THE INVENTION

Optical fiber gratings are key components in modern telecommunication systems for con- trolling the paths or properties of traveling light. Basically, optical fibers are thin strands of glass capable of transmitting an optical signal containing a large amount of information over long distances with very low loss. They are small diameter waveguides comprising a core having a first index of refraction surrounded by a cladding having a second (lower) index of refraction. Typical optical fibers are made of high purity silica with minor concentrations of dopants to control the index of refraction.

Optical gratings are important elements for selectively controlling specific wavelengths of light within optical systems. Such gratings include Bragg gratings, long period gratings and diffraction gratings. Such gratings typically comprise a body of material and a plurality of substantially equally spaced optical grating elements such as index perturbations, slits or grooves.

A typical Bragg grating comprises a length of optical waveguide, such as optical fiber, including a plurality of index perturbations substantially equally spaced along the waveguide length. Thee perturbations selectively reflect light of wavelength $\lambda$ equal to twice the spacing $\Lambda$ between successive perturbations times the effective refractive index, i.e. $\lambda = 2 n_{eff} \Lambda$, where $\lambda$ is the vacuum wavelength and $n_{eff}$ is the effective refractive index of the propagating mode. The remaining wavelengths pass essentially unimpeded. Such Bragg gratings have found use in a variety of applications including filtering, adding and dropping signal channels, stabilization of lasers, reflection of fiber amplifier pump energy, and compensation for waveguide dispersion.

Waveguide Bragg gratings are conveniently fabricated by doping a waveguide core with one or more dopants sensitive to ultraviolet light, e.g., germanium or phosphorous, and exposing the waveguide at spatially periodic intervals to a high intensity ultraviolet light source, e.g., an excimer laser. The ultraviolet light interacts with the photosensitive dopant to produce long-term perturbations in the local index of refraction. The appropriate periodic spacing of perturbations to achieve a conventional grating can be obtained by use of a physical mask, a phase mask, or a pair of interfering beams.

A long-period grating typically comprises a length of optical waveguide wherein a plurality of refractive index perturbations are spaced along the waveguide by a periodic distance $\Lambda'$ which is large compared to the wavelength $\lambda$ of the transmitted light. In contrast with convention Bragg gratings, long-period gratings use a periodic spacing $\Lambda'$ which is typically at least 10 time larger than the transmitted wavelength, i.e. $\Lambda' > 10\lambda$. Typically $\Lambda'$ is in the range 15–1500 micrometers, and the width of a perturbation is in the range $\frac{1}{5}\Lambda'$ to $\frac{4}{5}\Lambda'$. In some applications, such as chirped gratings, the spacing $\Lambda'$ can vary along the length of the grating.

Long-period fiber grating devices selectively remove light at specific wavelengths by mode conversion. In contrast with Bragg gratings in which light is reflected and stays in the waveguide core long-period gratings remove light without reflection, as by converting it from a guided mode to a non-guided mode. (A non-guided mode is a mode which is not confined to the core, but rather, is defined by the entire waveguide structure. Often, it is a cladding mode.) The spacing $\lambda'$ of ti e perturbations is chosen to shift transmitted light in the region of a selected peak wavelength $\lambda_p$ from a guided mode into a nonguided mode, thereby reducing in intensity a band of light centered about the peak wavelength $\lambda_p$. Alternatively, the spacing $\Lambda'$ can be chosen to shift light from one guided mode to a second guided mode (typically a higher order mode), which is substantially stripped off the fiber to provide a wavelength dependent loss. Such devices are particularly useful for equalizing amplifier gain at different wavelengths.

Diffraction gratings typically comprise reflective surfaces containing a large number of parallel etched lines of substantially equal spacing. Light reflected from the grating at a given angle has different spectral content dependent on the spacing. The spacing in conventional diffraction gratings, and hence the spectral content, is generally fixed.

A common difficulty with all of these grating devices is temperature sensitivity. In Bragg gratings, for example, both $n_{eff}$ and $\Lambda$ are temperature dependent, with the net temperature dependence for a grating in silica-based fiber exemplarily being about +0.0115 nm/° C. for $\lambda=1550$ nm. he temperature-induced shift in the reflection wavelength is primarily due to the change in $n_{eff}$ with temperature. While such a temperature-induced wavelength shift can be avoided by operating the grating device in a constant temperature environment, this approach requires an oven/refrigerator system. In addition, it requires accurate temperature-control and a continuous use of power.

U.S. Pat. No. 5,042,898 by W. W. Morey et al. discloses apparatus that can provide temperature compensation of a fiber Bragg grating. The apparatus comprises two juxtapose compensating members that differ with respect to the coefficient of thermal expansion (CTE). Both members have a conventional positive CTE. The fiber is rigidly attached to each of the members, with the grating disposed between two attachment points. The apparatus can be designed to apply tensile or compressive stress to the grating. In the latter case the grating is confined in a small tube, exemplarily a silica tube. The prior art designs are typically considerably longer than the grating, e.g. at least 40% longer than the grating device, thus making the temperature compensated package undesirably large. In addition, temperature compensating packages can have a substantial variation of reflection wavelength from one package to another because of the variability in the grating periodicity, minute variations, during package assembly, in the degree of pre-stress applied to each grating, and minute variations in the attachment locations. Accordingly, there is a need for compact temperature compensating fiber grating devices. There is also a need for simple fine adjustment of such device.

SUMMARY OF THE INVENTION

In accordance with the invention, a passively temperature-compensated tunable optical grating device comprises a grating, which is fixed at both ends to a support frame, and is mechanically or magnetically flexed so that a tensile strain induced in the grating reconfigures the resonant wavelength of the grating. Preferred embodiments include at least one waveguide grating, a flexing mechanism capable of inducing a latchable change in grating periodicity and at least one negative thermal expansion component which, upon heating, reduces the strain in the grating so that the temperature-induced wavelength shift is substantially cancelled out. The device can reduce the temperature-dependent wavelength change to less than 0.5 nm/100 deg. C, and preferably less than 0.05 nm/100 deg. C. In a preferred embodiment, the packaging assembly also includes a fine-wavelength adjusting mechanism for post-assembly corrective tuning. The device is especially useful in WDM communication systems, particularly for adding or dropping channels, for dynamically gain-equalizing optical amplifiers, for tunable lasers, and for dispersion compensation.

BRIEF DESCRIPTION OF THE DRAWINGS

The advantages, nature and additional features of the invention will appear more fully upon consideration of the illustrative embodiments described in the accompanying drawings. In the drawings.

It is to be understood that these drawings are for purposes of illustrating the concepts of the invention and are not to scale. The same reference numerals are used to designate similar elements throughout the drawings.

DETAILED DESCRIPTION

Figure 1A:
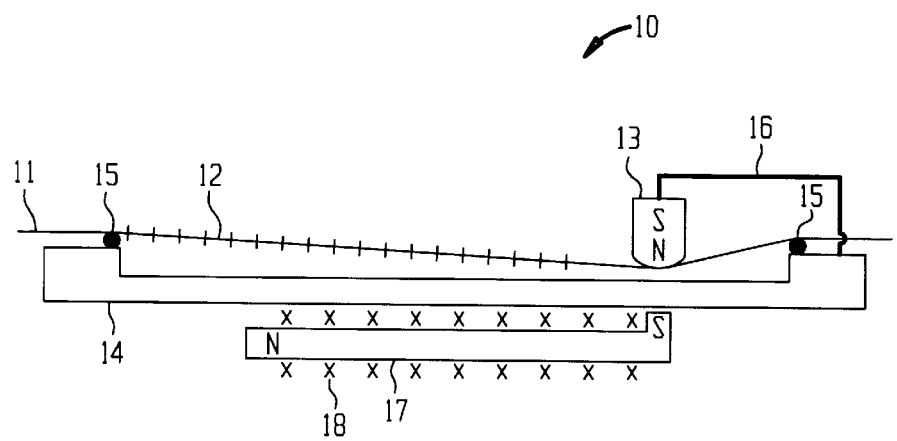
FIGS. 1(a) and (b) schematically illustrate exemplary temperature-compensated wave-length-tunable fiber grating devices.

Referring to the drawings, FIG. 1(a) schematically illustrates an exemplary temperature-compensated wavelength-tunable fiber grating device 10 comprising a length of optical fiber 11 including a grating 12 of index perturbations, a fiber-flexing moving body 13, and a temperature-compensating support frame 14. The fiber in the region of the grating is secured to the support frame as by bonds 15 or on either side of the grating 12. The bonds 15 can be epoxy, glass solder, alloy solder, or screws.

The optical fiber grating 12 can be a Bragg grating having a desired Bragg reflection wave length for dropping or adding a wavelength component or a long period grating with a periodicity for a desired peak wavelength of coupling. For a median light beam wavelength of 1550 nm, he Bragg grating periodicity $\Lambda$ in a $SiO_2$ based fiber (with a refractive index n~1.45) is about 500 nm. The length of each optical fiber grating to be incorporated into the grating assembly is typically in the range of 5 mm to 200 mm and preferably in the range of 10–100 mm. For a short fiber grating, the region of the regular fiber outside the grating can be used for attachment to either the magnetic components or the support frame.

The fiber 11 is pressed down (or pulled up) by body 13, preferably slightly outside the active grating region 12, so that a tensile strain is induced in the grating and the resonant wavelength is altered. It is preferred that the induced strain and the wavelength shift are made latchable as by using a latchable magnetically attractive or repulsive force. The moving body 13 can be a movable magnet which is connected to the support frame 14 by a spring arm 16. Body 13 is magnetically attracted, partially released, or fully released depending on the magnetization of an adjacent programmable magnet 17. While the use of non-latchable wavelength shift is also possible, one or more latchable programable magnets 17 are utilized if the retention of shifted wavelength without the use of continuous power is desired. By altering the electrical current in one or more solenoids 18 surrounding the programmable and latchable magnet 17, the altered magnetic field produces different levels of latched magnetization (M) in the magnet 17 and corresponding different fiber strain ($\epsilon$) after the field is removed. Hence the device produces different levels of latched wavelength shift in the grating.

In operation of the FIG. 1(a) device, the fiber flexing moving body is magnetically (or mechanically) actuated and latched. If a simple operation in a wavelength bistable mode is desired, the moving body is either completely pressed against the support to drop to a predetermined strain, frame to obtain a fixed fiber strain, or released to a prearranged stop or released completely so that the fiber is not strained at all, thus providing predetermined strain, fixed levels of grating wavelength. The magnetically-actuated fiber flexing is effected by magnetic pole interactions. The loving body 13 is made of a magnet (soft, semi-hard or hard, depending on specific designs) which is attracted or repelled by the pole from a programmable and latchable magnet 17. For wavelength channel add/drop operation in dense WDM systems, it is sometimes desirable to place the fiber Bragg grating wavelength at the in-between-channel position, and operate with a fixed $\Delta\lambda$ shift (e.g., by one-half the channel spacing to the nearest optical signal) to activate or deactivate the filter. Alternatively, the device can be actuated and latched at any intermediate position of the moving body or the movable magnet so that any desired, intermediate grating wavelength can be latchably obtained.

Since the rise in the temperature of the grating results in the increase of the Bragg wavelength $\lambda$ primarily due to the temperature-dependent increase in $n_{eff}$, it is necessary to reduce the grating periodicity $\Lambda$ to compensate the effect and make $\lambda$ temperature-independent. This is accomplished by pre-stressing the fiber grating by tension, and then relaxing the tension as the ambient temperature is increased (or causing the tension to be stronger as the temperature is lowered). For this purpose, the temperature compensating package needs a structural component the length of which contracts upon heating, i.e., a structure with a net negative coefficient of thermal expansion (CTE). For typical silica-based optical fiber gratings with a germanium doped core, the extent of the required thermal contraction strain upon heating for maintaining the temperature-insensitive Bragg wavelength is about $900 \times 10^{-6}$ for a temperature change of 100° C., i.e., an effective CTE of about $-9 \times 10^{-6}$° C.

Examples of desired negative CTE materials for the support frame include ceramic materials such as $ZrP_2O_7$, $ZrV_{2-x}P_xO_7$, and $ZrW_2O_8$. See articles by C. Martinek et al., J. Am. Ceram. Soc., Vol. 51, p. 227, 1968, T. A. Mary et al., Science, Vol. 272, p. 9, 1996, and V. Korthuis et al., Chem. of Materials, Vol. 7, p. 412, 1995. Instead of ceramics, metallic negative CTE materials such as Ni—Ti alloys (with 48–64 wt % Ni), Cu—Al—Zn alloys (with 1–10% Al, 20–40% Zn, bal. Cu), Cu—Al—Ni alloys (10–20% Al, 1–5% Ni, bal. Cu), Cu—Zn—Si alloys (30–40% Zn, 0.5–1.5% Si, bal. Cu), and Cu—Sn alloys (20–30% Sn, bal. Cu). See U.S. patent application Ser. No. 08/957,953, by Fleming et al., filed on Oct. 27, 1997. The material chemistry and processing of metallic, ceramic, or composite materials can be controlled to obtain a desired level of the negative CTE.

Figure 1B:
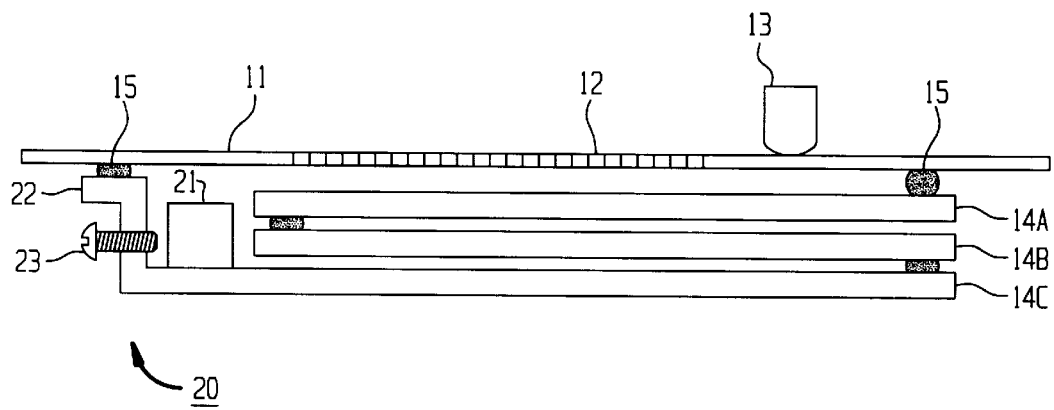

FIG. 1(b) shows an alternative embodiment wherein a net negative CTE structure can be obtained from a combination of three, positive- or zero-CTE materials placed in a compact zigzag configuration. The programmable magnet and the solenoid are not shown. The effective thermal contraction on heating is obtained by utilizing a differential negative CTE of two linear bodies 14A, 14B in a parallel configuration attached onto a third linear body 14C (which can be thought of as a substrate). These bodies can be round or rectangular rods, tubes, strips or any arbitrary shaped bars. Upon heating, the substrate 14C (CTE=$\alpha_3$, length=$L_3$) expands to the right, the high CTE component 14B (CTE=$\alpha_1$, length=$L_1$) expands to the left and the low CTE component 14A (CTE=$\alpha_2$, length=$L_2$) to the left. The overall effective CTE of the composite structure, $\alpha_{overall}$ (or the effective CTE imposed on the fiber grating with length $L_g$) is calculated by a relationship of $\alpha_{overall} \cdot L_g = \{(\alpha_2 L_2 + \alpha_3 L_3) - \alpha_1 L_1\}$. If the FIG. 1(b) structure is simplified by keeping the lengths of all the components the same ($L_1 = L_2 = L_3 = L_g$), then $\alpha_{overall} = \alpha_2 + \alpha_3 - \alpha_1$. In an even simpler case, one can use a zero expansion material such as Invar alloy as the substrate ($\alpha_3 \sim 0$), in which case the effective CTE $\alpha_{overall} = \alpha_2 - \alpha_1$, the differential CTE between the two components. For example, if Cu ($\alpha_1 = 16.5$ ppm) is the high CTE component and Nb ($\alpha_2 = 7.1$ ppm is the low CTE member, $\alpha_{overall} = 7.1 - 16.5 = -9.4$ ppm/° C. If a brass alloy ($\alpha_1 = 19.2$ ppm /° C.) is the high CTE component and Mo ($\alpha_2 = \alpha_3 = 5.1$ ppm/° C.) is the low CTE component and also t e substrate, $\alpha_{overall} = 5.1 + 5.1 - 19.2 = -9.0$ ppm/° C. Some examples of various materials combinations and the resultant overall CTEs are given in Table 1. The desired value of $\alpha_{overall}$ for the fiber grating can be obtained not only by the selection of suitable materials for the structure of FIG. 1(b) but also by controlling relative lengths of the high CTE body, low CTE body, substrate body and the fiber grating.

TABLE 1

Some examples of negative overall CTE obtained in the FIG. 1 structure.
($\alpha_{overall} = -\alpha_1 + \alpha_2 + \alpha_3$ for $L_1 = L_2 = L_3$)

| Component 1 ($\alpha_1$, ppm/° C.) | Component 2 ($\alpha_1$, ppm/° C.) | Component 3 ($\alpha_1$, ppm/° C.) | $\alpha_{overall}$ (ppm/° C.) |
|---|---|---|---|
| Al ($\alpha_1$ = 22.4) | Invar ($\alpha_2$ = 0.3) | Invar ($\alpha_3$ = 0.3) | −21.8 |
| Al—Cu (22.2) | W(4.6) | Invar (0.3) | −17.3 |
| Brass (19.5) | Mo (5.1) | Invar (0.3) | −14.1 |
| 304 Stainless St. (18.1) | Invar (0.3) | Mo (5.1) | −12.7 |
| Alumel (16.7) | Invar (0.3) | Ta (6.5) | −9.9 |
| Brass (19.5) | Mo (5.1) | Mo (5.1) | −9.3 |
| Monel (14.2) | W (4.6) | Invar (0.3) | −9.3 |
| Brass (19.5) | Hf (5.9) | W (4.6) | −9.0 |
| Al—Cu (22.2) | W (4.6) | Ti (8.5) | −9.1 |
| Co (12.5) | Invar (0.3) | Nb (7.1) | −5.1 |
| Nichrome (13.1) | W (4.6) | Ti (8.5) | 0 |
| Fe—52Ni (10.2) | Mo (5.1) | Mo (5.1) | 0 |
| Brass (19.5) | $Al_2O_3$ (9.2) | $SiO_2$ (0.7) | −9.6 |

It should be noted that the coefficient of thermal expansion of many metals and alloys can be altered as by texture formation, cold working, and variation in alloy composition by as much as a fee to several per cent. The $\alpha_{overall}$ can be altered by 0–10% through changing the relative lengths ($L_1$, $L_2$ and $L_3$).

The advantages of the temperature-compensating package are that i) the length of the package can be compact, essentially as short as the length of the fiber grating itself, ii) the desired negative CTE value can be obtained by a wide choice of various commercially available, low-cost metallic or non-metallic materials as well as by slightly altering the lengths of the device structure components, and iii) the bonding of most of the structural components can easily be accomplished by high-speed or low-cost processing such as spot welding, riveting, soldering or brazing.

For reliable packaging of optical fiber gratings, it is important to have a capability to finely adjust ("tweak") the Bragg reflection wavelength (or the peak coupling wavelength in long-period gratings) after the packaging is nearly completed. This is because there is some grating-to-grating variation in the periodicity ($\Lambda$) and hence in the reflection wavelength, which needs to be corrected by finely adjusting the tensile strain applied to the fiber grating. In addition, some package-to-package variation in the amount of tensile strain applied during industrial assembly and packaging is unavoidable, which needs to be corrected as well. A typical pre-strain on the fiber grating is in the range of 200–2000× $10^{-6}$, most typically about $500 \times 10^6$. This is equivalent to about 0.001 inch elongation for a 2" long grating, and a 0.6–0.8 nm shift (increase) in the reflection wavelength for communication light wavelength of, e.g., 1550 nm. Since the optical fiber gratings are relatively expensive, a means for post-assembly correction and salvaging of the packaged grating is highly desirable. An additional need for fine adjustment is so that the required pre-strain on the grating can conveniently be applied after the assembly instead of maintaining a constant tensile stress (stretching) during the fiber bonding processes.

The FIG. 1(b) embodiment also contains a mechanism 20 for fine adjustment of the wavelength. In essence, the mechanism adjusts strain which, in turn, finely adjusts the wavelength. A solid stud 21, preferably made of relatively strong metal, alloy or ceramic, is firmly bonded to one of the thermally expanding/contracting components, in this particular case, onto the low CTE component 14C. The bonding can be done preferably by spot welding, brazing, soldering. The use of epoxying, riveting or bolt-and-nut clamping is not excluded. In the bent-up portion 22 of component 14C, a threaded hole is drilled and a threaded screw 23 (preferably with a fine pitch threading for better movement control) is inserted and pushed against the fixed stud 21. As the threaded screw 23 is turned to an optimum position, the distance between the bent-up strip portion 22 and the stud 21 increases primarily by elastic bending of the bent-up strip. This in turn increases the tension on the fiber grating 12 and the grating 12 resulting in the optimally corrected ("tweaked") reflection wavelength of the grating. The materials used for the "tweaker" device, the stud and the screw, are preferably chosen, for the sake of simplicity, to be the same material as the component onto which they are attached. However in principle, any materials can be employed for the screw or the stud as long as their CTE values and the thermal expansion/contraction behavior are taken into consideration.

The wavelength adjusting scheme 20 (tweaker) is capable of straining the fiber grating by at least 0.0005 inch and shifting the wavelength by at least 0.5 nm with a wavelength tweaking resolution of better than 0.05 nm and preferably 0.01 nm or better. Instead of using the screw mechanism for the tweaker, other alternative configurations for altering the spacing between the bent-up portion and the stud can be utilized, for example, an insertable tapered wedge or replaceable pacer stacks.

The force transmitted from the movable magnet to the grating produces a strain which changes the wavelength response of the grating. The force between two attracting magnets is approximately proportional to the square of the magnetic induction (M) multiplied by the cross-sectional area (A) of the magnets at the gap (F $M^2 \cdot A$). Thus stronger magnets (higher M) or large magnets (larger A) give stronger force. However, strong magnets with high coercivity are difficult to magnetically switch. When the fiber grating is stretched or compressed, e.g., 1% in length ($\epsilon = \Delta l/l = 0.01$), the grating periodicity $\Lambda$ will also change. However, the resonating Bragg reflection wavelength $\lambda$ will not change by exactly 1%, since the interatomic distance in the glass is also affected by the elastic strain and as a result the refractive index n is altered. This strain effect on the refractive index can be represented by a photoelastic constant P. which is typically about 0.22 for the $SiO_2$ fiber. The wavelength change induced by the magnetically applied strain $\epsilon$ ($\epsilon = \Delta l/l$) is thus expressed as $\Delta\lambda/\lambda = (\Delta l/l)(1-P_e) = \epsilon(1-P_e)$. The strain $\epsilon$ is determined by the applied stress ($\sigma$) and the elastic modulus (E), $\epsilon = \sigma/E$, and the stress on the fiber is the force (F) divided by the cross-sectional area ($\pi r^2$) where r is the radius of the fiber grating.

Since optical fiber tends to break at a tensile strain of about 6%, and since such a failure would be disastrous, it is highly desirable to have a tunable grating design that automatically provide an upper limit in total tensile strain. The assembly configuration of FIG. 1 offers such an advantage because the pre-set gap between the unstrained fiber and the support frame serves as the upper limit for the extent of fiber flexing and tensile elongation of the fiber. The desired gap in FIG. 1 (the upper limit in vertical flexing of the fiber) is typically less than about 10% of the fiber length being stretched (with the corresponding maximum strain in the fiber grating of less than about 2%), and preferably less than 5% of the length of the grating-containing fiber. For example, for a 2" long grating, the vertical gap is set below about 200 mil, preferably below ~100 mil.

The preferred materials for the programmable magnet 17 are those whose magnetic properties are modifiable by a pulse magnetic field. They can be magnetically soft materials with very low coercivity (e.g., below ~10 Oe) such as Ni—Fe based permalloys, Fe—Co based permendur type alloys, or Si-steels. However, for a latchability of shifted wavelength without a continuous use of power, semi-hard magnetic materials are preferred, for example, low-coercivity (e.g. below ~200 Oe) Fe—Cr—Co, Fe—Al—Ni—Co (Alnico), Cu—Ni—Fe (Cunife), Co—Fe—V (Vicalloy), Fe—Mn, Fe—Mn—Ni, Fe—Mo—Ni. The desired range of the coercivity for the semi-hard magnet is typically below 500 Oe aid preferably below 100 Oe for the ease of polarity switching using solenoid pulse field. The coercivity is typically above 10 Oe and preferably above 30 Oe for maintaining the stability of the remanent magnetization and also for stability against demagnetization due to stray magnetic fields. For the semi-hard magnetic materials it is desirable that the switchable magnet have a relatively square magnetization hysteresis loop with the squareness ratio (remanent magnetization/saturation magnetization) of at least 0.85, preferably at least 0.90, even more preferably at least 0.95. Mechanically ductile and easily formable or machineable magnet alloys such as Fe—Cr—Co, Cu—Ni—Fe, Co—Fe—V are particularly desirable for shaping into desired rod-like geometry. Stable permanent magnets with high coercive forces (e.g., $H_c$>1000 Oe), such as Sm—Co, Nd—Fe—B or Ba-ferrite are less desirable as the programmable magnet (unless modified to exhibit lower coercive forces) because of the difficulty in switching using desirably low magnetic field.

The programmable magnet 17 is operated by adding at least one solenoid winding 18 around it and applying a programmed pulse or a short-duration field to switch the polarity or alter the magnitude of magnetization in the magnet. This adjustment alters the force and the strain on the fiber grating, and hence optical signal wavelength (or amplitude in the case of long period grating). The desired duration or speed of the pulse field is typically in the range of $10-10^{-6}$ seconds and preferably $10^{-1}-10^4$ seconds. For a thick magnet geometry, the use of pulses that are too fast is not desirable because of the eddy current loss. The shape of the current pulse can be rectangular, rectified sinusoidal or irregular as long as the maximum field needed for the desired magnetic switching is accomplished.

Since a sharp (small curvature) bending of an optical fiber or a grating is not desirable, it is advantageous to minimize such a deformation when the fiber is flexed. One convenient way of achieving such a goal is to utilize a rounded post in the support frame and place the fiber-to-frame bonding spots slightly outside the peak of the rounded post. When the fiber is flexed, the gentle curvature of the post allows a smooth transition in fiber bending, and prevents the undesirable sharp bending of the fiber. Low-friction coating materials such as teflon or diamond-like-carbon may be applied on the surface of the moving body or the curvatured post to reduce possible friction-related problems after repeated fiber flexing operations.

Figure 2A:
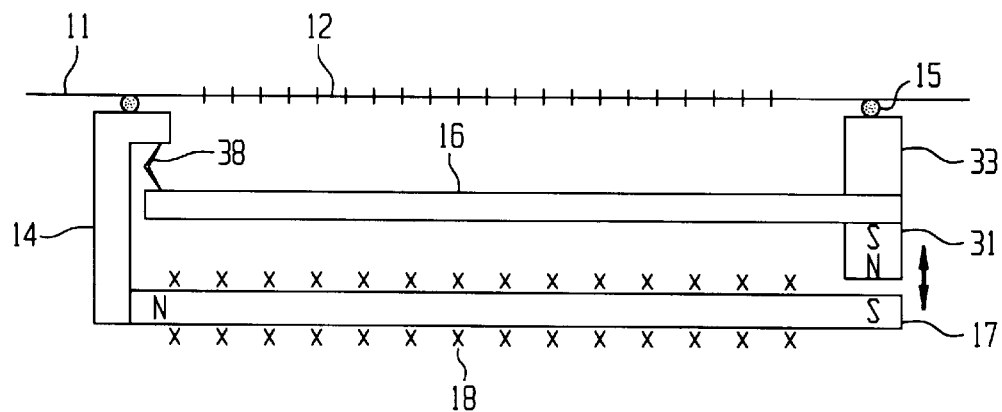
FIGS. 2(a) and (b) schematically illustrate alternative embodiments of the invention.

FIGS. 2(a) and (b) show alternative embodiments of temperature-compensated, tunable grating devices. In these devices, a length of the moving body 16 is magnetically (or mechanically actuated and latched to a certain position, thus causing the attached fiber grating 12 to be flexed and elastically strained for a desired wavelength shift. The grating can be attached via a supporting body 33. The moving body 16 is attached to the support frame 14 by a spring 30. The moving body 16 can be a magnetic component or it can have an attached magnet 31 which is controllably and latchably attracted or repelled by the programmable magnet 17. For temperature compensation, the moving body 16 is made of a negative CTE material described earlier, preferably with a CTE in the range of $-8$ to $-12\times 10^{-6}$/deg. C, specifically with a CTE of close to $-9\times 10^{-6}$/deg. C in the case of $SiO_2$ fiber.

Figure 2B:
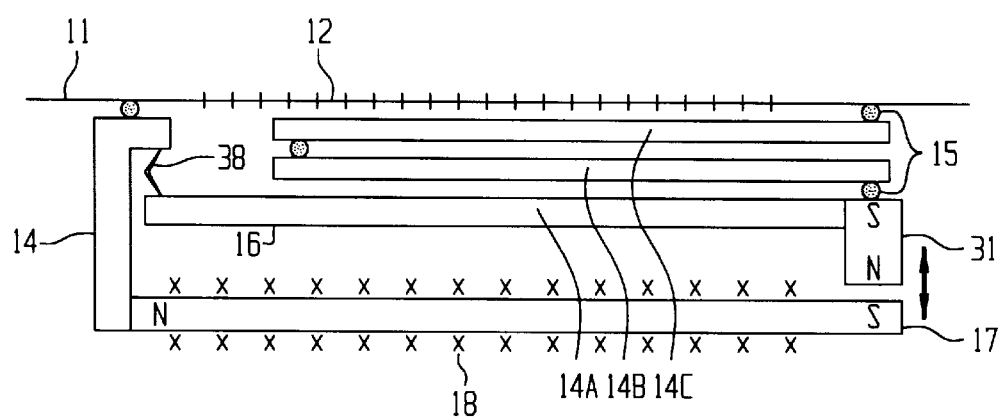

The FIG. 2(b) embodiment utilizes the effective negative CTE structure described in connection with FIG. 1(b), with preferred CTE of $-8$ to $-12\times 10^{-6}$/deg. C to achieve the desired temperature-compensating effect.

In a real-life situation, unavoidable variations in device dimensions, assembly procedures, component materials, and the magnitude of pre-straining in the fiber grating may cause the base-wavelength ($\lambda_o$) of the grating as well as the intended amount of the wavelength shift ($\Delta\lambda$) to deviate from the desired, preset values. A post-assembly correction or tweaking of $\lambda_o$ and $\Delta\lambda$ is often desirable. Such a tweaking capability is particularly useful for a bistable mode device in which only two stable positions and hence only two stable wavelength states are available.

There are three novel approaches of fine adjusting (tweaking) $\lambda_o$ and $\Delta\lambda$ which are applicable to the magnetically wavelength-tunable grating devices described herein:
(1) The use of surface collapsible spring(s) on the moving body or a grating surface which it contacts. In bistable, wavelength-tunable devices, a certain minimum magnetic force is required to actuate the shifting of the magnetic body from one stable position to the other. If the magnetic force is increased beyond that required for the switching, e.g. by increasing the latchable magnetization in the programmable magnet, the collapsible spring can allow a slight additional displacement of the movable magnet, and hence, a slight additional wavelength change in the grating, as desirable.

(2) The use of magnetostrictive support frame or magnetostrictive programmable magnet material. Here, a slight change in the length of the support frame or the magnet by magnetostriction is utilized to tweak $\lambda_o$ or $\Delta\lambda$, or both. In positive magnetostrictive materials such as Fe, Co, and their alloys, the magnetization causes the length to increase, while the opposite is observed in negative magnetostrictive materials such as Ni, and some of its alloys. The magnitude of magnetostriction is typically $10$–$1000\times 10^{-6}$, and the remnant (or latchable) magnetostriction is somewhat smaller than these values. As an example, a magnetostriction-induced length change of say, $20\times10^{-6}$ inch per inch in a fiber grating with $\lambda_o$ of say 1500 nm would produce about 30 picometers shift in $\lambda_o$, a reasonably fine control capability for $\lambda_o$ or $\Delta\lambda$.

(3) The use of mechanical adjustment of the support frame. As illustrated in FIG. 1(b), the pre-strain in the fiber grating of the assembled tunable grating structure can be altered and hence $\lambda_o$ and $\Delta\lambda$, by using a screw-based adjusting mechanism which can apply or release the tensile strain the fiber grating. Instead of the screw mechanism, one or more of spacers with preset thicknesses can be inserted into an appropriately designed slot in the support frame to induce a similar fine wavelength-adjusting effect.

The temperature-compensated gratings disclosed herein are not restricted to bistable or continuously tunable devices. A tri-stable or higher-order digital tuning is also possible. For example, by adding more than one moving bodies or movable magnets in the device of FIG. 1, multi-state devices can be constructed.

The desired temperature dependence of grating wavelength in the temperature- compensated gratings described herein is preferably less than 0.0010 nm/deg. C, and more preferably less than 0.0003 nm/deg. C.

The described temperature-compensated gratings are especially useful in wavelength division multiplexed communication systems which employ multiplexer/demultiplexer devices. In such systems, a "trunk" fiber carries optical signal channels at several wavelengths $\lambda_1$, $\lambda_2$, ... $\lambda_n$ and it is desirable to extract a single wavelength channel from the trunk fiber or to add a single wavelength channel onto the trunk. A wide variety of such devices can be made by interconnecting optical circulators and fiber gratings. Typically the channel reflected by the grating is dropped to the trunk fiber or is added to the trunk. Gratings as described herein permit selection at the grating of which channel is dropped or added.

Figure 3:
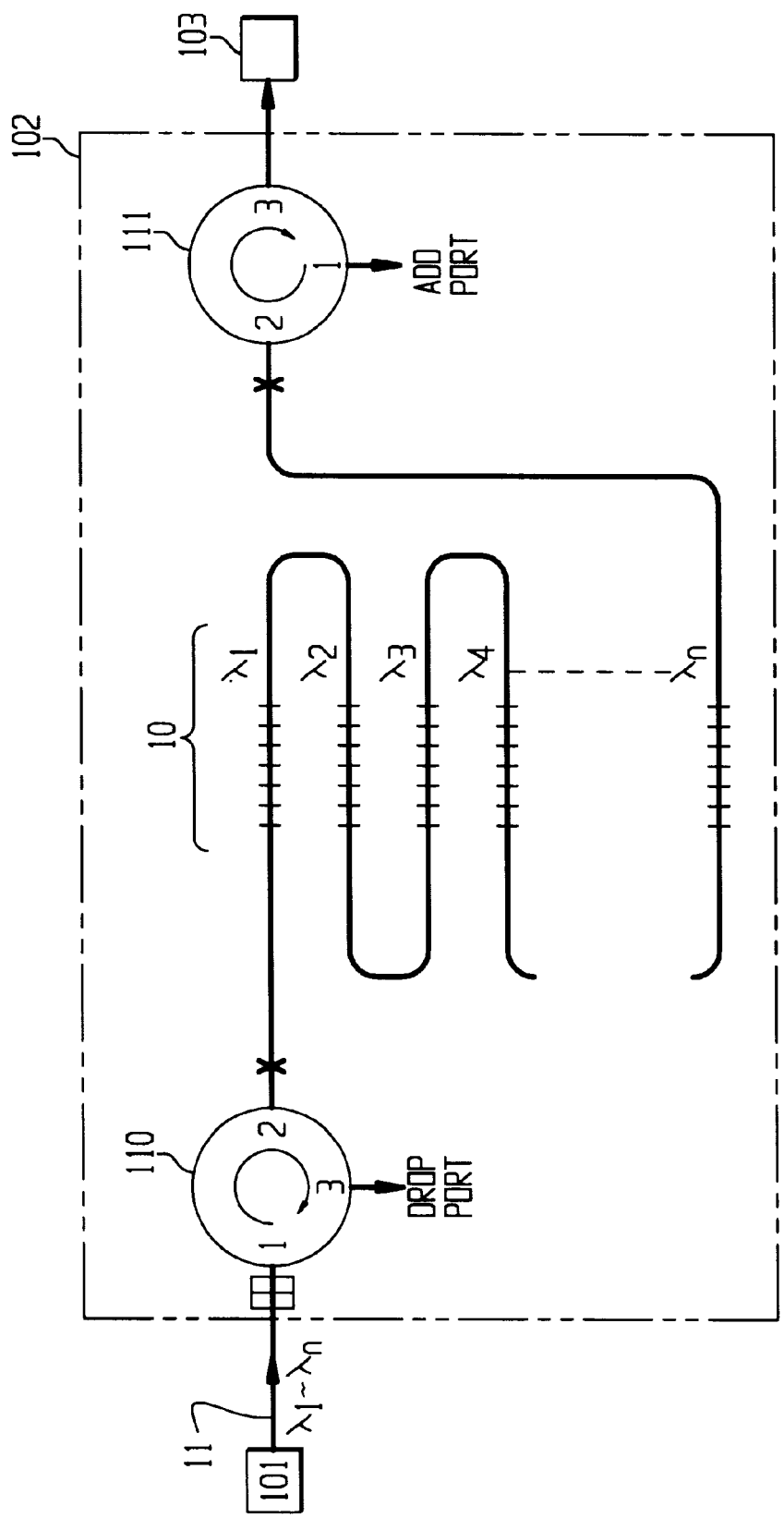
FIG. 3 shows an N channel add/drop WDM communication system using temperature-compensated tunable gratings.

FIG. 3 schematically illustrates a wavelength division multiplexed (WDM) communications system comprising a transmitter 101, an improved N-channel ADD/DROP multiplexer/demultiplexer 102 and a receiver 103, all connected by trunk fiber 11. The input on fiber 11 consists of optical signals at several wavelengths, $\lambda_1$ to $\lambda_n$.

The improved multiplexer 102 comprises one or more pairs (here 1 pair) of circulators, corn rising an upstream circulator 110 and a downstream circulator 111. A series of bistable temperature compensated tunable gratings 10 are placed between the circulators, with their grating wavelengths located at between-channel wavelengths. Actuation of a desired grating for one-half channel shift in wavelength drops or adds the adjacent communication channel.

If a selected group of channels needs to be dropped (or filtered), the magnetic tuning devices for those gratings are activated by a magnetic pulse field so as to strain the fiber gratings by ½ channel, e.g., $\Delta\lambda/\lambda$ of roughly 0.4 nm/1550 nm≈0.025%. To cancel the DROP operation of a channel reverse-polarity magnetic field (or a demagnetizing field) is applied to the magnet element to switch to the other stable position and shift back the wavelength by ½ channel. The ADD operation is performed in a similar manner but with a backward transmission through a circulator and Bragg reflection in the forward direction. The temperature-dependent shift of the grating wavelength is less than 0.0001 nm/deg. C.

The magnetically switchable fiber grating assembly provides advantages for a variety of optical fiber communication devices and communication operation systems. For example, a chirp Bragg grating (e.g., a grating with a gradient periodicity covering $\lambda_1$ through $\lambda_4$ along the length of one grating, or with the four distinct grating structures written in series in one grating length) can be made magnetically switchable between two strain positions. In this case, the four channels are dropped or added simultaneously as a group. A plurality of chirped gratings can be connected so that the group-wise add/drop operation of channels can be performed covering a wide bandwidth.

Figure 4:
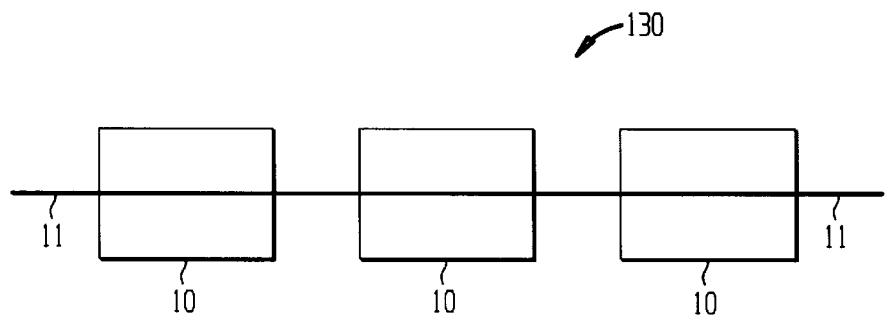
FIG. 4 schematically illustrates a wide band tunable loss filter using tunable gratings.
Figure 5:
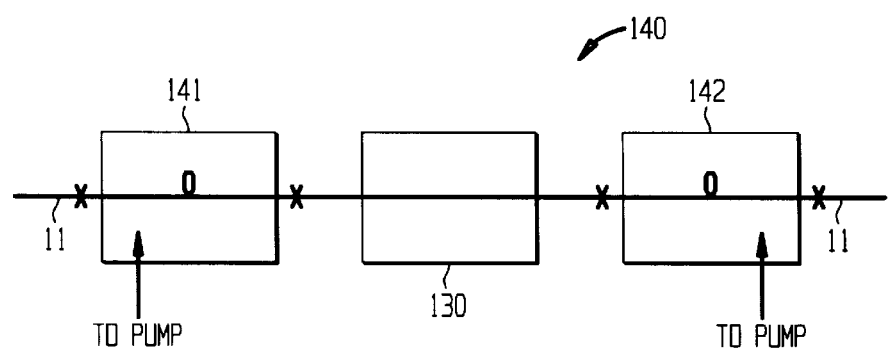
FIG. 5 shows a dynamically gain-flattened optical amplifier using tunable gratings.

The grating 12 in the temperature-compensated tunable grating devices can be a long-period grating. FIG. 4 illustrates tunable loss filter 130 covering a bandwidth wider than a single long period grating device. It is constructed by concatenating magnetically tunable temperature compensated long-period gratings 10 along a single fiber 11. A desired loss spectrum can be obtained by selectively activating the gratings with different $\Delta\lambda$ shift capabilities. Long-period gratings or flattening the response of an amplifier are described, for example, in U.S. Pat. No. 5,430,817 issued to A. M. Vengsarkar on Jul. 4, 1995, which is incorporated herein by reference FIG. 5 illustrates a dynamically gain-flattened amplifier 140 made by including the temperature compensated tunable loss filter 130 in a fiber rare earth doped amplifier (such as an erbium-doped fiber amplifier). The amplifier 140 preferably comprises a plurality of rare-earth fiber amplifier stages (e.g. two stages 141 and 142) with the tunable loss filter 130 advantageously preferably disposed at the output of the first stage. This arrangement gives the highest power and the lowest noise figure. For applications where noise is less important, the filter 130 can be placed in front of the first stage 141. For applications where power is less important, it can be placed at the output of the last stage 142. Such devices 140 can be used in WDM optical communication systems to ensure equalized amplification under a wide variety of conditions.

Figure 6:
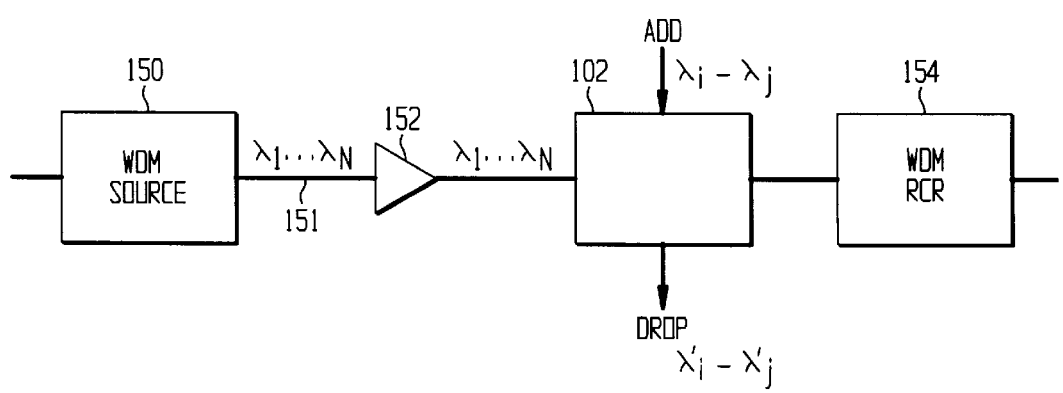
FIG. 6 schematically illustrates an optical WDM communication system which can employ the add/drop device of FIG. 3 and the amplifier of FIG. 5.

FIG. 6 schematically illustrates an optical WDM communication system using the gain-flattened amplifier 140. The system comprises a source 150 of modulated WDM optical signal channels $\lambda_1$, $\lambda_2$, ... $\lambda_n$ along a trunk fiber 151. The channels pass through one or more gain equalized amplifiers 140, which can comprise the amplifier shown in FIG. 5, and through one or more ADD, DROP devices 102, which can comprise the ADD/DROP device shown in FIG. 3.

It is to be understood that the above-described embodiments are illustrative of only a few of the many possible specific embodiments which can represent applications of the invention. The magnetically or mechanically switchable and latchable devices described here are also useful for making various other types of non-fiber optical gratings for the purpose of reconfiguring or tuning wavelength, amplitude or phase of optical information. For example, slitted gratings, transmission type or reflection-type grooved gratings, or phase gratings can be made magnetically tunable, according to the invention, for various optical applications such as for producing fresnel lenses, holographic images, and optical memory devices. Numerous and varied other arrangements can be made by those skilled in the art without departing from the spirit and scope of the invention.

What is claimed:

1. A passively temperature-compensated, wavelength-tunable optical grating device comprising:

a support frame for supporting a length of optical waveguide, the support frame comprising material or structure with a negative coefficient of thermal expansion;

an optical waveguide grating comprising a length of optical waveguide including an optical grating, the waveguide attached to the support frame on opposite sides of the grating;

a movable body for pushing or pulling laterally on the waveguide to elastically flex the waveguide and induce a tensile strain therein, thereby altering the resonant wavelength of the grating;

the device having a length which is not more than 50% longer than the grating length and the grating, when attached to the frame, having a temperature-dependent wavelength change of less than 0.002 nm/deg. C.

2. The device of claim 1 wherein the support frame comprises material selected from negative CTE ceramic materials.

3. The device of claim 1 wherein the support frame comprises material selected from negative CTE metallic materials.

4. The device of claim 1 wherein the support frame comprises a composite structure comprising three linear elements placed in a zigzag configuration with at least one element having a positive CTE.

5. The device of claim 1 wherein the negative CTE is in the range of −8 to −12×10/deg. C.

6. The device of claim 1 wherein the waveguide comprises a length of optical fiber.

7. The device of claim 1 wherein the grating is a Bragg grating.

8. The device of claim 1 wherein the grating is a long-period grating.

9. The device of claim 1 wherein the grating is a diffraction grating.

10. The device of claim 1 including means for mechanically moving the movable body.

11. The device of claim 1 wherein said movable body is latchable.

12. The device of claim 1 including means for magnetically moving the movable body.

13. The device of claim 1 wherein the movable body is magnetic and the device include a programmable magnet for moving the magnetic movable body.

14. The device of claim 13 wherein the programmable magnet is latchable.

15. The device of claim 14 wherein the magnetization latching of the programmable magnet after the applied field is removed, is at least 80% of the magnetization when the field is on.

16. The device of claim 1 wherein the movable body includes an elastically deformable surface.

17. An optical multiplexer/demultiplexer comprising an optical grating device according to claim 1.

18. An N-channel optical ADD/DROP multiplexer/demultiplexer comprising an optical of grating device according to claim 1.

19. An optical waveguide amplifier comprising a long period optical grating device according claim 1.

20. The grating device of claim 1 wherein said grating is a chirped grating.

21. The device according to claim 1 including a tweaking mechanism for adjusting the wavelength of the grating after fabrication.

* * * * *